United States Patent
Bachl et al.

(10) Patent No.: US 9,124,467 B2
(45) Date of Patent: Sep. 1, 2015

(54) RECEIVER GAIN ADJUSTMENT TO REDUCING AN INFLUENCE OF A DC OFFSET

(75) Inventors: Rainer Bachl, Nuremberg (DE); Steffen Reinhardt, Nuremberg (DE)

(73) Assignee: TELEFONAKTIEBOLAGET L M ERICSSON (PUBL), Stockholm (SE)

( * ) Notice: Subject to any disclaimer, the term of this patent is extended or adjusted under 35 U.S.C. 154(b) by 0 days.

(21) Appl. No.: 13/990,620

(22) PCT Filed: Nov. 30, 2010

(86) PCT No.: PCT/EP2010/068567
§ 371 (c)(1),
(2), (4) Date: May 30, 2013

(87) PCT Pub. No.: WO2012/072122
PCT Pub. Date: Jun. 7, 2012

(65) Prior Publication Data
US 2013/0251078 A1    Sep. 26, 2013

(51) Int. Cl.
| H04L 27/08 | (2006.01) |
| H04L 25/06 | (2006.01) |
| H03G 3/30  | (2006.01) |
| H04B 1/30  | (2006.01) |
| H03M 1/18  | (2006.01) |

(52) U.S. Cl.
CPC ............ *H04L 25/061* (2013.01); *H03G 3/3073* (2013.01); *H03M 1/18* (2013.01); *H04B 1/30* (2013.01)

(58) Field of Classification Search
CPC ..... H04L 25/061; H03M 1/18; H03G 3/3073; H04B 1/30

USPC ......................................................... 375/345
See application file for complete search history.

(56) References Cited

U.S. PATENT DOCUMENTS

| 5,896,064 A | * | 4/1999 | Kaku ............................ 330/279 |
| 6,259,391 B1 | * | 7/2001 | Pakravan et al. .............. 341/139 |
| 6,321,073 B1 | * | 11/2001 | Luz et al. .................... 455/239.1 |
| 6,654,593 B1 | * | 11/2003 | Simmons et al. ........... 455/234.1 |
| 6,748,200 B1 | * | 6/2004 | Webster et al. ............ 455/234.1 |
| 8,737,941 B2 | * | 5/2014 | Rozenblit et al. .......... 455/127.2 |
| 2003/0002522 A1 | * | 1/2003 | Kim et al. ..................... 370/465 |
| 2005/0020226 A1 | * | 1/2005 | Mohindra .................. 455/232.1 |
| 2005/0145777 A1 | * | 7/2005 | Barna et al. ................. 250/208.1 |
| 2008/0085685 A1 | * | 4/2008 | Mantravadi et al. ........ 455/115.3 |
| 2009/0016376 A1 | * | 1/2009 | Sawai .......................... 370/465 |
| 2010/0177423 A1 | * | 7/2010 | Dahle et al. .................... 360/46 |
| 2011/0215857 A1 | * | 9/2011 | Nonin ........................... 327/307 |
| 2013/0093496 A1 | * | 4/2013 | Waters et al. ................. 327/365 |

FOREIGN PATENT DOCUMENTS

| EP | 0 813 294 A2 | 12/1997 |
| WO | 0156177 A1 | 8/2001 |
| WO | 02067420 A2 | 8/2002 |

* cited by examiner

*Primary Examiner* — Erin File
(74) *Attorney, Agent, or Firm* — Rothwell, Figg, Ernst & Manbeck, P.C.

(57) ABSTRACT

The invention refers to generating a digital signal from an analog signal, wherein the analog signal is amplified according to a gain control value before being converted to a digital value by means of an analog-to-digital converter, wherein a DC offset value of the analog signal is determined, and the gain control value is generated as a function of the dynamic range of the analog-to-digital converter and the DC offset value. The invention further refers to a corresponding circuit and a computer program.

13 Claims, 4 Drawing Sheets

RECEIVER GAIN ADJUSTMENT TO REDUCING AN INFLUENCE OF A DC OFFSET

CROSS REFERENCE TO RELATED APPLICATION(S)

This application is a 35 U.S.C. §371 National Phase Entry Application from PCT/EP2010/068567, filed Nov. 30, 2010, designating the United States, the disclosure of which is incorporated herein in its entirety by reference.

TECHNICAL FIELD

The present invention generally relates to receivers comprising analog-to-digital conversion and especially relates to a mitigation of DC offset within radio frequency receivers.

BACKGROUND

Direct current—DC—offset is a distortion that might lead to a performance decrease at an output of an analog-to-digital converter of any receiver. DC offset can be defined as a deviation from zero of the mean amplitude of the analog signal to be converted to a digital signal.

DC offset is frequently encountered in radio frequency—RF—receivers while generating a baseband signal, e.g. in so-called direct-conversion receivers that are used In telecommunications to demodulate incoming RF by mixing it with a local oscillator signal synchronized in frequency to the carrier of the wanted signal.

FIG. 1 shows a basic structure of a direct conversion receiver according to the prior art, direct conversion receiver by way of example comprising a bandpass filter or diplexer 102, a pre-amplifier and down conversion circuit 104, this circuit comprising a first variable gain amplifier 1042, a local oscillator 1044, and a mixer or down converter 1046, a second variable gain amplifier 106, an analog-to-digital converter 108 and baseband processor 110 connected in series. A RF signal S_RF is received by an antenna and provided to the bandpass filter 102 that generates a bandpass signal S_BP by selecting one carrier frequency out of a plurality of carrier frequencies of the RF signal S_RF. The first variable gain amplifier 1042 generates an amplified bandpass signal from the bandpass signal S_BP according to a first gain control value Gain_1. The Mixer 1046 receives both the amplified bandpass signal and an oscillator signal generated by the local oscillator 1044 and generates a down-mixed signal S_BB, in the following also being referred to as baseband signal S_BB. The second variable gain amplifier 106 generates an amplified down-mixed or analog signal S_A from the down-mixed signal S_BB according to a second gain control value Gain_2. The analog-to-digital converter—ADC—108 converts the analog signal S_A into a digital signal S_D that is provided to the baseband processor 110 for further digital processing.

In order to achieve a trade-off between distortions caused by signal clipping or saturation and distortions caused by signal quantization at the ADC 108, the total gain Gain_1× Gain_2 might be adjusted such that a so-called target value for the power of the baseband signal after analog-to-digital conversion—ADC—is obtained, e.g.

$$20\log_{10}\left\{\frac{\gamma_{ADC} \cdot \text{Gain\_1} \cdot \text{Gain\_2} \cdot \sqrt{P_{RF}}}{FS}\right\} = \text{Target Value [dBFS]}$$

wherein FS corresponds to the full scale value per quadrature component after ADC, $P_{RF}$ is the power of the RF signal at the antenna within the system bandwidth considered, and $$\gamma_{ADC} = \frac{\sigma}{\sqrt{P}}$$

is the nominal gain due to the ADC, whereby $\sigma$ is the standard deviation of the complex valued baseband signal per quadrature component after ADC, and P is the power of the baseband signal before ADC. It might be noted that $\gamma_{ADC}$ itself is also dependent on the target value in dBFS since clipping or saturation of the signal at the FS value reduces the average power $\sigma^2$ of the signal.

One reason for DC offset within direct conversion receivers is local-oscillator energy leaking through the mixer to the antenna input and other parts of the receiver front-end circuitry and then re-entering the mixer (the effect is also being referred to as self-mixing). The DC offset might additionally depend on specific implementation details, e.g. crosstalk attenuation, shielding and element tolerances. The DC offset however causes a degradation of the functioning of the receiver, e.g. due to saturation or clipping effects if not being accounted for.

It is known to remove a DC offset by filtering e.g. with a DC notch filter. DC notch filtering can significantly attenuate or almost completely remove the DC offset, but it might introduce significant distortions to the frequency characteristics (e.g. subcarriers) near to DC. In order to minimize such distortion, a DC notch filter would need to have a very narrow lowpass filter characteristics, which is difficult to realize. However, practically used DC notch filters have a relatively smooth transition band between the passband at the low frequencies and the stopband at the higher frequencies. Such filter also attenuates at frequencies near to DC. Further, a narrow lowpass characteristic in the frequency domain corresponds to a long impulse response in the time domain, which might cause inter-symbol interference when the composite channel impulse response exceeds a certain length. Moreover, practical DC notch filter implementations often introduce group delay variations around the DC subcarrier, which causes larger channel estimation losses in the baseband processing.

SUMMARY

It is an object of the present invention to improve a performance of a receiver in the presence of DC offset.

This object is achieved by the independent claims. Advantageous embodiments are described in the dependent claims.

The invention is based on the insight that a performance of a receiver can be improved by accounting for a DC offset in the optimization of the dynamic range of the ADC rather than performing a DC offset filtering.

In an embodiment of the invention, a digital signal is generated by amplifying an analog signal corresponding to a gain control value and converting this signal into a digital value by means of an analog-to-digital converter, wherein a DC offset value of the analog signal is determined, and the gain control value is determined as a function of the DC offset value and dynamic range characteristics of the analog-to-digital converter The term dynamic range thereby corresponds to the range from the smallest supported value to the largest supported values for a given quantization of the signal.

In an embodiment, the gain control value is generated such that a distortion power due to signal clipping and to signal quantization is reduced, preferably essentially reduced to a minimum, wherein reducing or minimizing might mean increasing or maximizing the effective signal to quantization and clipping noise ratio.

In an embodiment, the DC offset value is determined as a function of an actual parameter or state associated to the receiver. Therein, the DC offset value might be indicative of a maximum assumed DC (DC upper limit) offset associated to the actual state or parameter. Alternatively the DC offset value might be determined as a function of an actual DC offset measurement.

In an embodiment, the analog signal is a baseband signal being generated by down-mixing a selected one of a plurality of carrier frequencies of a radio frequency signal being received at an antenna of the receiver.

In an embodiment, a so-called direct conversion—DC— receiver comprises a pre-amplifier and a down-mixing stage being coupled between an input circuit (e.g. a bandpass filter coupled to the antenna) and the amplifier as described above, wherein the down-mixing is performed by pre-amplifying the selected radio frequency according to a pre-gain control value signal and self-mixing a corresponding pre-amplified signal with an oscillator signal at the selected carrier frequency.

In an embodiment, the parameter or state associated to the receiver is a value indicative of an operating status of a pre-amplifier of the receiver, preferably of a gain value controlling an amplification of the pre-amplifier.

In an embodiment, the DC offset value is determined by means of a DC carrier signal of the radio frequency signal.

The present invention also concerns computer programs comprising portions of software codes in order to implement the method as described above when operated by a respective processing unit of a user device and a recipient device. The computer program can be stored on a computer readable medium. The computer-readable medium can be a permanent or rewritable memory within the user device or the recipient device or located externally. The respective computer program can be also transferred to the user device or recipient device for example via a cable or a wireless link as a sequence of signals.

In the following, detailed embodiments of the present invention shall be described in order to give the skilled person a full and complete understanding. However, these embodiments are illustrative and not intended to be limiting.

DETAILED DESCRIPTION

In the following description of preferred embodiments, for purposes of explanation and not limitation, specific details are set forth (such as particular signal processing components and sequences of steps) in order to provide a thorough understanding of the present invention. It will be apparent to one skilled in the art that the techniques described herein may be practiced in other embodiments that depart from these specific details. For example, while the following embodiments will primarily be described in context with a direct conversion receiver, the present invention may also be implemented in other receivers that suffer from DC offset.

Moreover, those skilled in the art will appreciate that the functions and steps explained herein below may be implemented using hardware and/or software functioning in conjunction with a programmed microprocessor, an Application Specific Integrated Circuit (ASIC), a Digital Signal Processor (DSP) or a general purpose computer. It will also be appreciated that while the following embodiments will primarily be described in context with methods and devices, the invention may also be embodied in a computer program product as well as in a system comprising a computer processor and a memory coupled to the processor, wherein the memory is encoded with one or more programs that may perform the services, functions and steps disclosed herein.

Figure 1:
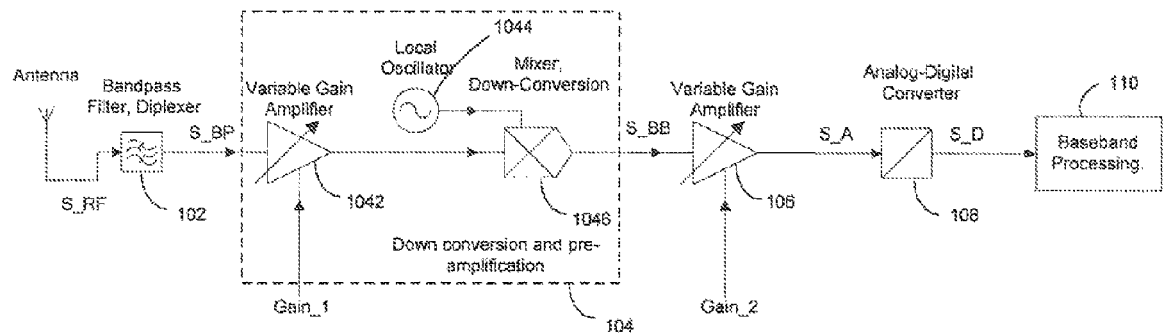
FIG. 1 shows an block diagram of a direct conversion radio frequency receiver according to the prior art as discussed in the background section.
Figure 2:
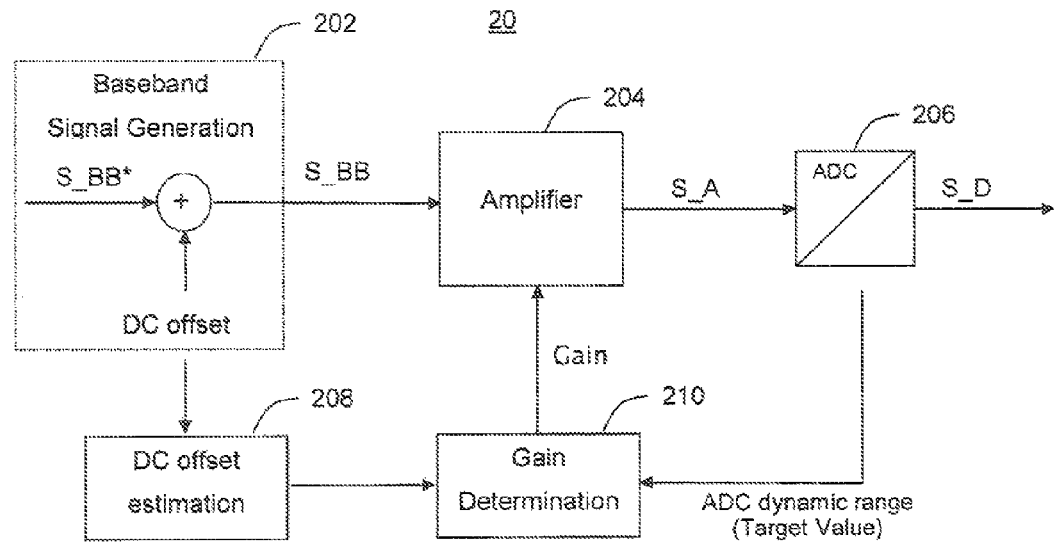
FIG. 2 shows a principle block diagram of a radio frequency receiver comprising a gain adjustment taking into account a DC offset.

FIG. 2 shows a principle signal receiver 20 comprising a baseband signal generator 202, an amplifier 204, an analog-to-digital converter 206, a DC offset estimator 108 and a gain determination unit 210. The baseband signal generator 202 is not shown in any details here, but for explanatory reasons it will be assumed that a DC offset is added to a virtual or ideal baseband signal S_BB* to form the (real) baseband signal S_BB. Similar to FIG. 1, the baseband signal S_BB is provided to the amplifier 204 that generates an amplified analog signal S_A by amplifying the baseband signal S_BB according to a gain signal. The DC offset estimator 208 determines a DC offset value by any estimation and/or measurement of the DC offset or to an DC offset upper-bound value. Examples for determining values of the DC offset will be described in embodiments of in the following figures. The gain determination unit 210 generates the gain for the amplifier 204 as a function of the received signal characteristics (mean amplitude, mean power, maximum amplitude, etc.) and DC offset value of the analog-to-digital converter 206. The gain might be adjusted such the signal-to-noise ratio is maximized, or in other words that distortions caused by signal clipping or saturation and signal quantization at the analog-to-digital converter 206 are minimized.

In the following, exemplary embodiments are described applying the above-described gain setting to the direct conversion radio frequency receiver as shown in FIG. 1. In order to provide an optimal match between the power range of the baseband signal S_BB and the analog-to-digital converter, both the signal characteristics and the DC offset of the baseband signal S_BB should preferably be known for the gain setting. Such example is described under FIG. 4. However, it might not always be possible to predict an actual value for the DC offset, but an actual upper-bound value associated to the DC offset. Such example is described under the FIG. 3.

Figure 3:
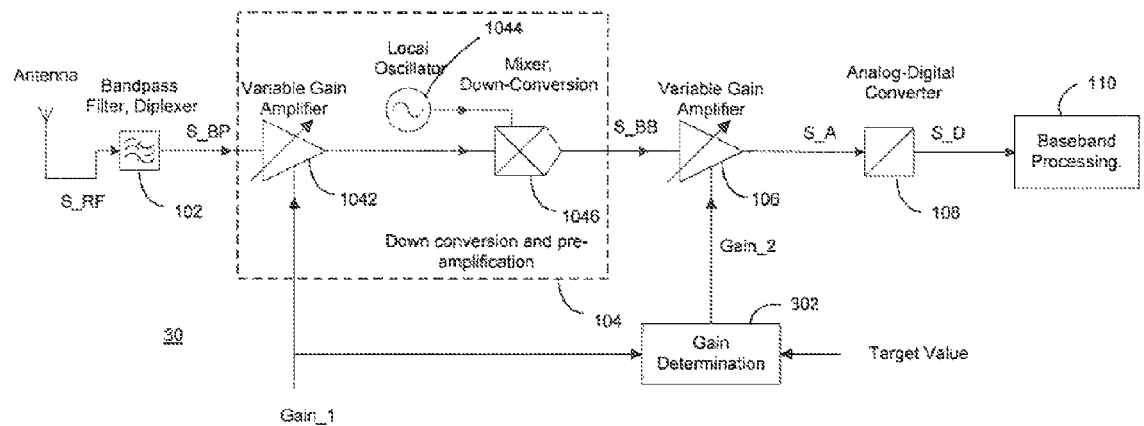
FIG. 3 shows a first exemplary block diagram of a direct conversion radio frequency receiver comprising a gain adjustment taking into account a presumed known maximum DC offset.

FIG. 3 refers to a first embodiment of a direct conversion radio frequency receiver comprising a gain adjustment taking into account a DC offset. FIG. 3, in the following being referred to as first direct conversion receiver 30. Similar to the prior art direct conversion receiver of FIG. 1, DC receiver 30 comprises bandpass filter or diplexer 102, pre-amplifier and down conversion circuit 104, second variable gain amplifier 106, analog-to-digital converter 108 and baseband processor 110 connected in series. Additionally, first direct conversion receiver 30 comprises a gain adjustment circuit for controlling the second variable gain amplifier 106. Thereto, the gain adjustment circuit comprises a first gain determination unit 302 adapted to generating the second control value Gain_2 as a function of the target value and the first control value Gain_1, as well as received signal characteristics such as mean amplitude, power. Compared with the receiver of FIG. 2, the second variable gain amplifier 106 corresponds to the amplifier 204 and consequently, the control value Gain corresponds to the second control value Gain_2.

Since DC offset is created from self-mixing of the oscillator signal, the amount of DC offset is dependent on the first variable gain setting Gain_1. The first direct conversion receiver 30 makes use of the dependency of the DC offset on the first control value Gain_1. The DC offset as a function of Gain_1 might be measured or upper bounded e.g. by some worst case analysis with respect to crosstalk attenuation for self-mixing of the oscillator signal. Hence, the worst case DC offset can be assumed to be known as a function of Gain_1. The change of the target value can also be tabulated as a function $\Delta_1$ of Gain_1. The gain setting of the AGC can then be described as:

Gain_2=$f$(Target Value+$\Delta_1$(Gain_1))

The invention might be advantageously used in cases where an adjustment of the first amplifier gain (Gain_1) is possible, e.g. continuously over a certain range, or over a set of discrete values within a certain range.

Figure 5:
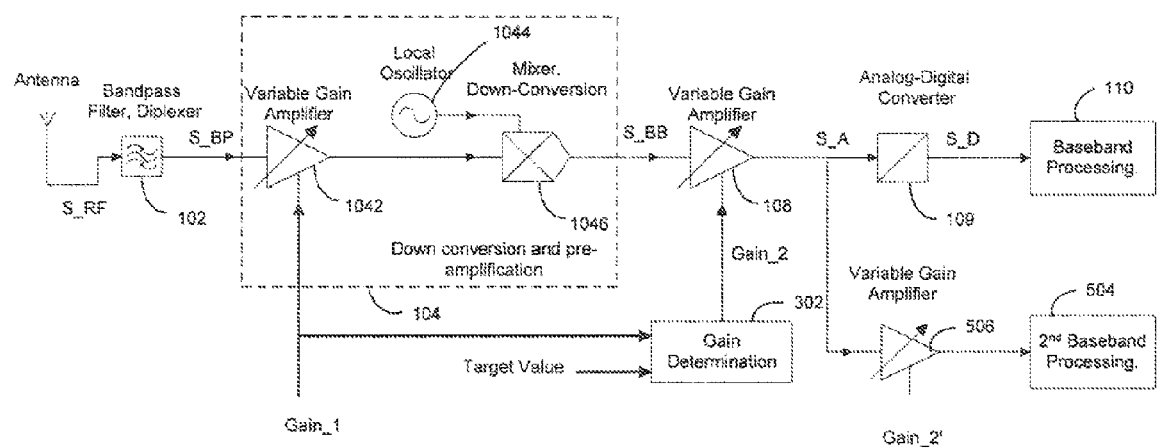
FIG. 5 shows an exemplary variant to FIG. 3.

The same principle might be extended to a receiver with a re-quantization stage comprising an additional variable gain amplifier 504 and an additional baseband processor 506 as shown in FIG. 5. This case might also include the case of a quantization after ADC, e.g. for sigma-delta converters.

Figure 4:
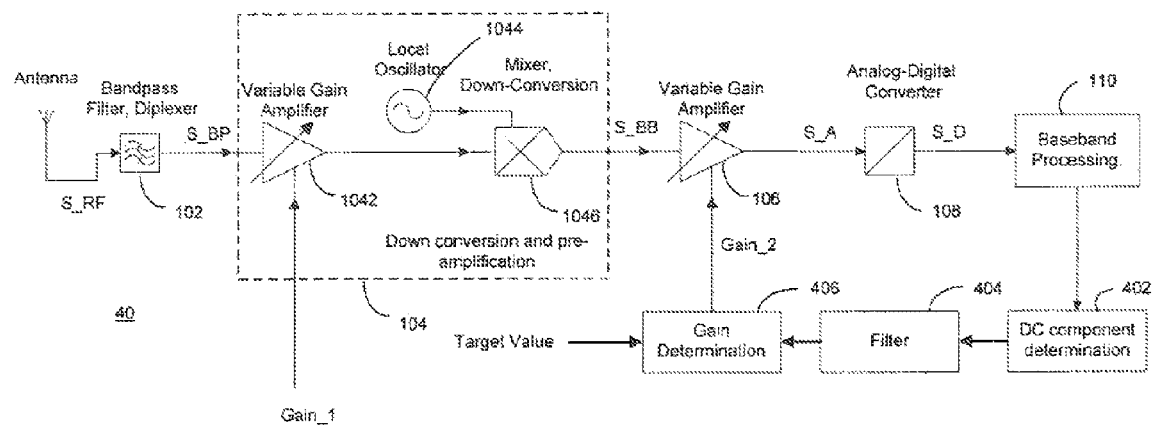
FIG. 4 shows a second exemplary block diagram of a direct conversion radio frequency receiver comprising an alternative gain adjustment with respect to FIG. 3 based on DC offset estimation.

FIG. 4 refers to an alternative embodiment of a direct conversion radio frequency receiver comprising a gain adjustment taking into account a DC offset, in the following being referred to as second direct conversion receiver 40. Differently to the first DC receiver 30, the second DC offset receiver 40 performs a measurement of the DC offset for the gain control. Similar the first direct conversion receiver 30, the second direct conversion receiver 40 comprises bandpass filter or diplexer 102, pre-amplifier and down conversion circuit 104, second variable gain amplifier 106, analog-to-digital converter 108 and baseband processor 110 connected in series. Further similar, the second DC offset receiver 40 comprises a gain adjustment circuit, but differently to FIG. 3, comprising a DC offset estimation unit 402, a digital filter 404 (optional) and an alternative gain determination unit 406.

The alternative gain determination unit 406 is connected (over optional digital filter 404) and the DC offset estimation unit 402 to the baseband processor 110 to provide some measured or filtered values of the DC offset. Further, the alternative gain determination unit 406 receives the target value associated to the analog-to-digital converter 108. The alternative gain determination unit 406 generates the second control value Gain_2 as a function of the target value and the measured DC offset value as being described in more details in the following.

Direct DC offset measurements are particularly appropriate in OFDM based systems, as the DC measurement is a by-product of the FFT (Fast Fourier Analysis) used in the receiver. Note that the FFT output for DC is not used for data transmission and, hence, the FFT output for DC corresponds to the DC offset measured for every OFDM symbol.

The measurements might be processed as follows:

DC offset estimation: In a first step the two quadrature components of the measured DC offset values are used to obtain a real valued quantity characteristic for the DC offset. Typically, the absolute value of the complex valued DC measurement is used, but it would also be possible to process the absolute value of one quadrature component only.

Filtering: In a second step, a digital filter is employed to obtaining a better statistics about the DC offset. There are various alternatives for the filtering. For instance, filtering could be a simple averaging operation over a finite observation window, or filtering could extract the maximum value over a finite observation window. As the filtering operation might introduce some undesired latency, which might causes some temporary gain maladjustments when the DC offset is changing, the filter characteristics might be chosen to achieve a trade-off of both the filter latency and the filter statistics.

Gain setting: In a third step, the second control value Gain_2 is determined. The change of the target value can be tabulated as a function $\Delta_2$ of the post-processed measurements DCest. The gain setting of the AGC can then be described by the following equation:

Gain_2=$f$(Target Value+$\Delta_2$(DCest))

Alternatively, the equation could be written as:

Gain_2=Gain_$2_0$+f'(DCest), wherein Gain_$2_0$ is the value in an absence of DC offset, and f(DCest) is a variation of the gain as a function of DCest (dependent on DCest, f' can be a negative or a positive).

Figure 6:
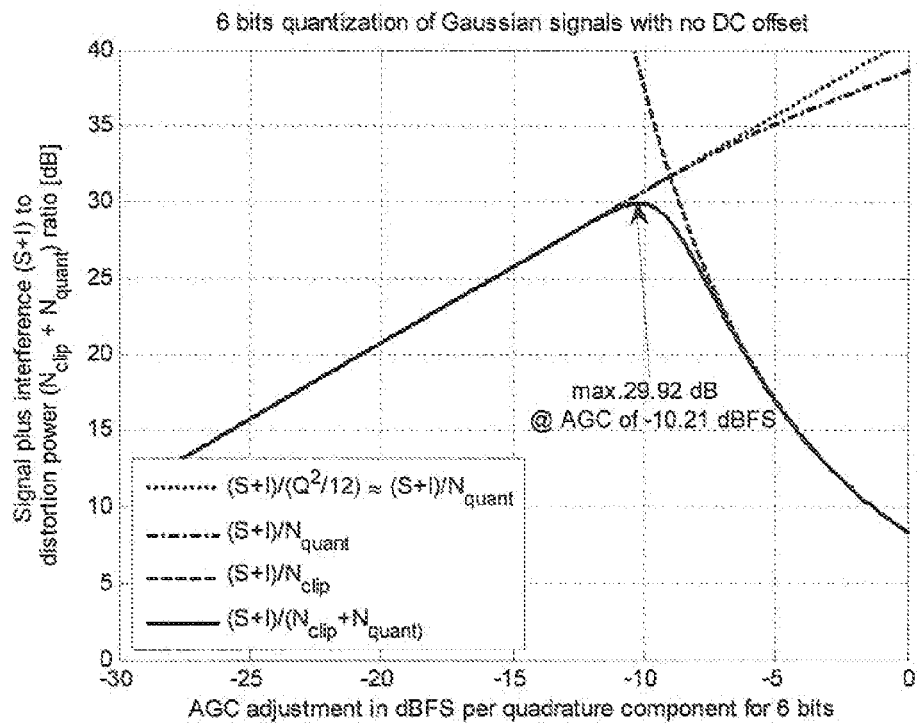
FIG. 6 shows an exemplary diagram of an exemplary ADC dynamic range versus noise without DC offset.

FIG. 6 shows a diagram of an exemplary ADC dynamic range versus noise without DC offset. The achievable dynamic range or (S+I)/(Nclip+Nquant) is a function of the target value in dBFS, whereby exemplarily the input signal is Gaussian distributed and quantized with 6 bits. As can be depicted from FIG. 6, for these conditions the dynamic range is maximized at a target value of −10.21 dBFS. In real environments, the actual target might be chosen to be lower, e.g. to mitigate for any of: AGC maladjustments, propagation conditions with fading channels, and rapid signal changes due to scheduling or absence of data transmissions. The target value is typically obtained by a gain setting (Gain_2) as a function of the Target Value and the power of the input signal.

Figure 7:
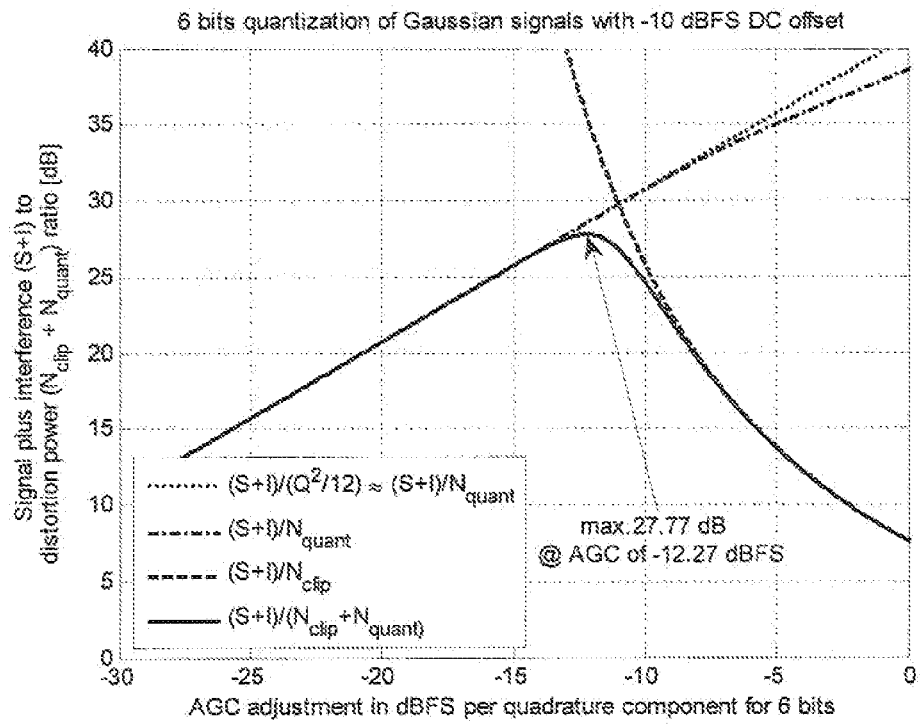
FIG. 7 shows an exemplary diagram of an exemplary ADC dynamic range versus noise taking into account an exemplary amount of DC offset.

FIG. 7 shows a diagram of an exemplary ADC dynamic range versus noise taking into account an exemplary amount of DC offset of 10 dBFS (that might be regarded as a worst case), again for Gaussian input signals with 6 bits quantization. It is to be noted that the change $\Delta$ of the target value is obtained by minimizing the distortions from saturation/clipping (Nclip) and quantization noise (Nquant) in the presence of DC offset. With the exemplary (worst case) DC offset of −10 dBFS for Gaussian input signals with 6 bits quantization as shown in FIG. 7, the dynamic range is maximized at a gain setting corresponding to −12.27 dBFS. From a comparison with FIG. 6, the change of the target value is $\Delta$=−2 dB.

In FIG. 7, DC offset is explicitly accounted for in the optimization of the dynamic range, i.e. the gain setting (Gain_2) becomes dependent on the target value and the DC offset. Considering a worst case scenario with a maximum DC offset, the gain setting can be expressed as a function of a change $\Delta$ of the target value by the following equation:

Gain_2=$f$(Target Value+$\Delta$)

The invention claimed is:

1. A method of generating a digital signal from an analog signal, wherein the analog signal is amplified according to a first gain control value and a second gain control value before being converted to a digital value by an analog-to-digital converter, the method comprising:
   amplifying the analog signal according to the first gain control value;
   determining a DC offset value of the analog signal;
   generating the second gain control value as a function of a dynamic range of the analog-to-digital converter and the DC offset value, wherein the DC offset value is a function of the first gain control value; and
   amplifying the analog signal according to the second gain control value before being converted to the digital value by the analog-to-digital converter.

2. The method of claim 1, wherein the gain control value is generated such that a combined distortion power due to signal clipping and to signal quantization is reduced or minimized.

3. The method of claim 1, wherein the DC offset value is determined as a function of an actual parameter or state that affects the DC offset.

4. The method of claim 3, wherein the actual state or parameter is indicative of one of: an upper limit of the absolute DC offset, an upper limit of a mean absolute DC offset, an absolute DC offset, and a mean absolute DC offset.

5. The method of claim 1, wherein the analog signal is a baseband signal being generated by down-mixing a selected one of a plurality of carrier frequencies of a radio signal.

6. The method of claim 5, wherein the down-mixing is performed by pre-amplifying the selected radio frequency according to a pre-gain control value signal and self-mixing a corresponding pre-amplified signal with an oscillator signal at the selected carrier frequency.

7. The method of claim 6, wherein the DC offset is determined as a function of the pre-gain control value.

8. The method of claim 5, wherein the DC offset value is derived by determining a power of the DC carrier signal of the radio signal.

9. The method of claim 8, wherein the selected radio frequency signal is a OFDM signal, and wherein the DC offset value is determined by evaluating a subcarrier corresponding to a frequency of zero after a FFT.

10. The method of claim 9, wherein the determination of the DC offset value is performed based on one of:
    determining an absolute value of the complex valued DC measurement, and
    determining an absolute value of one quadrature component.

11. The method of claim 9, wherein the determination of the DC offset value is performed based on determining an absolute value of one or a plurality of quadrature components and wherein a digital filter is employed to filter the result of an evaluation of the one or the plurality of quadrature components by one of:
    averaging over a finite observation window, and
    extracting a maximum value over a finite observation window.

12. A receiver for generating a digital signal from an analog signal being derived from a received radio signal, wherein the analog signal is amplified according to a first gain control value and a second gain control value before being converted to a digital value by an analog-to-digital converter, the receiver comprising:
    a first amplifier that amplifies the analog signal according to the first gain control value;
    a processor adapted for determining a DC offset value of the analog signal;
    a generator adapted for generating the second gain control value as a function of a dynamic range of the analog-to-digital converter and the DC offset value, wherein the DC offset value is a function of the first gain control value; and
    a second amplifier that amplifies the analog signal according to the second gain control value before being converted to the digital value by the analog-to-digital converter.

13. A non-transitory computer program loadable into a mobile terminal, the computer program comprising code adapted to execute the method of claim 1.

* * * * *